(12) United States Patent
Grant

(10) Patent No.: US 7,814,446 B1
(45) Date of Patent: Oct. 12, 2010

(54) METHOD AND APPARATUS FOR PROVIDING A PROTECTION CIRCUIT FOR PROTECTING AN INTEGRATED CIRCUIT DESIGN

(75) Inventor: Douglas M. Grant, Gorebridge (GB)

(73) Assignee: Xilinx, Inc., San Jose, CA (US)

( * ) Notice: Subject to any disclaimer, the term of this patent is extended or adjusted under 35 U.S.C. 154(b) by 229 days.

(21) Appl. No.: 12/052,015

(22) Filed: Mar. 20, 2008

Related U.S. Application Data

(62) Division of application No. 10/985,508, filed on Nov. 10, 2004, now Pat. No. 7,376,929.

(51) Int. Cl.
G06F 17/50 (2006.01)
G06F 9/45 (2006.01)

(52) U.S. Cl. ............................................. 716/4; 716/5
(58) Field of Classification Search .................. 716/4–5
See application file for complete search history.

(56) References Cited

U.S. PATENT DOCUMENTS

| | | | |
|---|---|---|---|
| 4,341,925 A | 7/1982 | Frosch et al. | |
| 6,173,235 B1 | 1/2001 | Maeda | |
| 6,198,301 B1 | 3/2001 | Chetlur et al. | |
| 6,336,208 B1 | 1/2002 | Mohan et al. | |
| 6,446,242 B1 | 9/2002 | Lien et al. | |
| 6,617,990 B1 | 9/2003 | Lorenzo-Luaces et al. | |
| 6,618,839 B1 | 9/2003 | Beardslee et al. | |
| 6,747,480 B1 | 6/2004 | Kaptanoglu et al. | |
| 6,874,107 B2 | 3/2005 | Lesea | |
| 6,876,186 B1 | 4/2005 | Gupta | |
| 7,028,281 B1 * | 4/2006 | Agrawal et al. ............... 716/12 |
| 7,183,799 B1 | 2/2007 | Donlin et al. | |
| 7,376,929 B1 | 5/2008 | Grant | |
| 7,484,081 B1 | 1/2009 | Langhammer et al. | |
| 2002/0010853 A1 | 1/2002 | Trimberger et al. | |
| 2002/0093356 A1 * | 7/2002 | Williams et al. ............ 324/765 |
| 2003/0023912 A1 | 1/2003 | Lesea | |
| 2003/0172363 A1 * | 9/2003 | Chauhan et al. ............... 716/16 |
| 2004/0024806 A1 | 2/2004 | Jeong et al. | |
| 2004/0236961 A1 | 11/2004 | Walmsley | |

(Continued)

OTHER PUBLICATIONS

Touba et al.; "Altering a Pseudo-Random Bit Sequence for Scan-Based BIST"; 1996; IEEE; All pages.*

(Continued)

*Primary Examiner*—Jack Chiang
*Assistant Examiner*—Suresh Memula
(74) *Attorney, Agent, or Firm*—Robert M. Brush

(57) ABSTRACT

A method and apparatus for providing a protection circuit for protecting an integrated circuit design is described. In one example, a sequence generator is defined to produce a pseudorandom sequence of output vectors. A plurality of output vectors is selected from the sequence of output vectors. Bits from the plurality of output vectors are randomly selected to define a terminal vector. Detection logic is generated for detecting the terminal vector. In another example, a protection circuit is defined for asserting a signal after a plurality of clock cycles. At least one lookup table (LUT) is identified in the implemented circuit design having at least one unused input terminal. The signal is coupled to the at least one unused input terminal of the at least one LUT. The protection circuit and the circuit design are then implemented.

4 Claims, 6 Drawing Sheets

U.S. PATENT DOCUMENTS

| | | | |
|---|---|---|---|
| 2005/0040855 | A1 | 2/2005 | Boerstler et al. |
| 2005/0102539 | A1 | 5/2005 | Hepner et al. |
| 2006/0049886 | A1 | 3/2006 | Agostinelli et al. |
| 2006/0075374 | A1* | 4/2006 | McElvain .................. 716/17 |
| 2006/0215743 | A1 | 9/2006 | Lang et al. |

OTHER PUBLICATIONS

Kohlbrenner et al.; "An Embedded True Random Number Generator for FPGAs"; Feb. 2004; ACM; All pages.*

Tsoi et al.; "Compact FPGA-based True and Pseudo Random Number Generators"; 2003; IEEE; All pages.*

Jas et al.; "Hybrid BIST Based on Weighted Pseudo-Random Testing: A New Test Resource Partitioning Scheme"; 2001; IEEE; All pages.*

Krishna et al.; "Hybrid BIST Using an Incrementally Guided LFSR"; 2003; IEEE; All pages.*

Fischer et al.; "True Random Number Generator Embedded in Reconfigurable Hardware"; 2002; IEEE; All pages.*

U.S. Appl. No. 10/985,508, filed Nov. 10, 2004, Douglas.

U.S. Appl. No. 12/052,013, filed Mar. 20, 2008, Douglas.

Dini Group, The, "PCI Hosted, ASIC Prototyping Engine," DN2000k10 product specification, May 2000, pp. 1-3, available from www.dinigroup.com.

Goering, Richard, "'Digital Signature' technology aids IP protection," *EE Times*, Mar. 25, 1998, pp. 1-2, downloaded from http:/www.eetimes.com/news/98/1000news/digital.html on Oct. 14, 2007.

Jain, Adarsh K. et al., "Zero Overhead Watermarking Technique for FPGA Designs," *Proceedings of the 2003 ACM Great Lakes Symposium on VLSI (GLSVLSI '03)*, Apr. 28-29, 2003, pp. 147-152, Washington, DC.

Kahng, Andrew B. et al., "Constraint-Based Watermarking Techniques for Design IP Protection," *IEEE Transactions on Computer-Aided Design of Integrated Circuits and Systems*, Oct. 2001, pp. 1236-1252, vol. 20, No. 10.

Lach, John et al., "Robust FPGA Intellectual Property Protection Through Multiple Small Watermarks," *Proceedings of the 36th ACM/IEEE Conference on Design Automation (DAC'99)*, Jun. 21-25, 1999, pp. 831-836, New Orleans, Louisiana.

U.S. Appl. No. 11/179,451, filed Jul. 12, 2005, Nisbet et al.

Chang, Chih-Wei (Jim), "Layout-Driven Hot-Carrier Degradation Minimization Using Logic Restructuring Techniques", *Proc. of the 38th Annual Design Automation Conference*, Jun. 18, 2001, pp. 1-6, ACM, New York, New York.

Clement, J. Joseph et al., "Methodology for Electromigration Critical Threshold Design Rule Evaluation," *IEEE Transactions on Computer-Aided Design of Integrated Circuits and Systems*, May 1999, pp. 576-581, IEEE, Piscataway, New Jersey, USA.

*The Controversial Bits*, 1 page, downloaded Sep. 24, 2004 from http://people.freenet.de/s.urfer/conditioning.htm.

Gladkikh, A. et al., "Correlation Between Electromigration Damage Kinetics and Microstructure in Cu Interconnects", *Proc. of the 27th European Solid-State Research Conference*, Sep. 22, 1997, pp. 448-451, Editions Frontieres, Gif sur Yvette Cedex, France.

Hara, Yoshiko, "NEC claims breakthrough in high-k dielectrics," *Electronic Engineering Times*, Sep. 27, 2004, Issue 1340, 3 pages, Electronic Engineering Times at http://www.eetimesgroup.com.

Lloyd, J.R., *Electromigration for Designers: An Introduction for the Non-Specialist*, Apr. 12, 2002, pp. 1-9, downloaded Jan. 12, 2005 from http://www.techonline.com.

Luryi, Serge et al., "Hot Electron Injection Devices", *Superlattices and Microstructures*, received Nov. 27, 1984, publ. 1985, vol. 1, No. 5, pp. 389-400, Elsevier, Maryland Heights, Missouri, USA.

NASA, "Specific Concerns in Space Applications: Hot Electron Effects", *NEPP—General Reliability and Radiation Concerns*, 1 page, downloaded Jul. 9, 2004 from http://nepp.nasa.gov/index_nasa.cfm/909/.

Peters, Laura, "Early Failures are Key in Copper Electromigration", *Semiconductor International*, Jul. 1, 2002, 1 page, downloaded Aug. 16, 2004 from http://www.keepmedia.com:/jsp/article_detail_print.jsp.

Sanchez, Julian J., "Hot-Electron Resistant Device Processing and Design: A Review", *IEEE Transactions on Semiconductor Manufacturing*, received Mar. 11, 1988, publ. Feb. 1989, pp. 1-8, vol. 2, No. 1, IEEE, Piscataway, New Jersey, USA.

Sullivan, Tim, "Electromigration" tutorial, *1999 Integrated Reliability Workshop (IRW)*, Oct. 18, 1999, 3 pages, downloaded Jul. 9, 2004 from http://www.irps.org/irw/99/Tuts.htm.

Tyree, Vance C., *Reliability in CMOS IC Design: Physical Failure Mechanisms and their Modeling*, Nov. 15, 2000, pp. 1-8, The Mosis Service, Marina del Rey, California, USA, downloaded from http://www.mosis.com/Fags/tech_cmos_rel.pdf.

Watts, Joe et al., "Hot Electron Degradation in SOI MOSFETs", *Annual Research Summary*, Section 8, Jul. 1, 1994, 1 page, available from Purdue University, School of Electrical and Computer Engineering, West Lafayette, Indiana, USA, downloaded Aug. 24, 2004 from http://dynamo.ecn.purdue.edu/ECE/Research/ARS/ARS95/Sec8/8_24.html.

Wikipedia, "Electromigration", pp. 1-4, last modified and downloaded Aug. 16, 2004 from http://en.wikipedia.org/wiki/Electromigration.

* cited by examiner

METHOD AND APPARATUS FOR PROVIDING A PROTECTION CIRCUIT FOR PROTECTING AN INTEGRATED CIRCUIT DESIGN

FIELD OF THE INVENTION

One or more aspects of the present invention relate generally to integrated circuit design systems and, more particularly, to a method and apparatus for providing a protection circuit for protecting an integrated circuit design.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

To implement a circuit design using an FPGA, the design is synthesized to produce a logical representation, which is then mapped onto programmable logic blocks, placed within the FPGA, and routed using the programmable fabric. The place and route phases of implementing a circuit design involve generating a layout of the circuit elements on the FPGA and defining the signal lines (routing resources) that connect the elements. When designing a circuit for an FPGA, a designer may utilize pre-defined circuit designs provided by a third party vendor on a fee basis. Such pre-defined circuit designs are referred to as intellectual property (IP) cores or IP blocks.

Vendors typically provide IP cores to their customers for a pre-defined evaluation period, after which the IP cores must be purchased. It is desirable to prevent unauthorized use of an IP core after the evaluation period has expired. Otherwise, the recipient of the evaluation IP core will be able to circumvent paying the fee for the core after the evaluation period has expired. Accordingly, there exits a need in the art for a method and apparatus for providing a protection circuit for protecting an integrated circuit design

SUMMARY OF THE INVENTION

An aspect of the invention relates to generating a protection circuit for protecting an integrated circuit design. In one embodiment, a sequence generator is defined to produce a pseudorandom sequence of output vectors. A plurality of output vectors is selected from the sequence of output vectors. Bits from the plurality of output vectors are randomly selected to define a terminal vector. Detection logic is generated for detecting the terminal vector.

Another aspect of the invention relates to protecting a circuit design implemented for a programmable logic device. A protection circuit is defined for asserting a signal after a plurality of clock cycles. At least one lookup table (LUT) is identified in the implemented circuit design having at least one unused input terminal. The signal is coupled to the at least one unused input terminal of the at least one LUT. The protection circuit and the circuit design are then implemented.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

A method and apparatus for providing a protection circuit for protecting an integrated circuit design is described. One or more aspects of the invention are described with respect to providing a protection circuit for protecting a circuit design for an FPGA. Those skilled in the art will appreciate, however, that the present invention may be used to implement circuit designs for other types of programmable logic devices, such as complex programmable logic devices (CPLDs), and other types of integrated circuits, such as application specific integrated circuits (ASICs).

Figure 1:
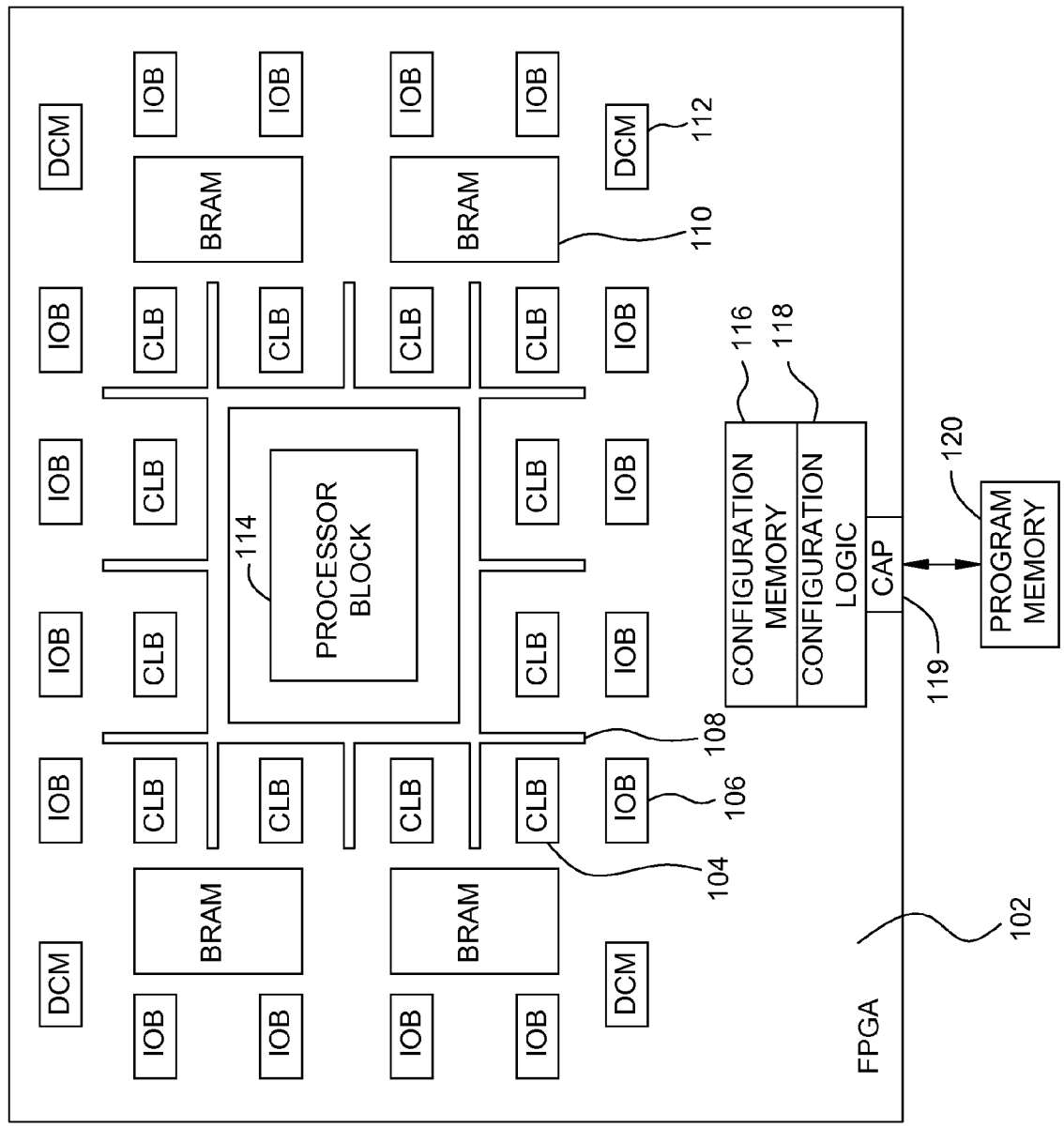
FIG. 1 is a block diagram depicting an exemplary embodiment of an FPGA coupled to a program memory.

FIG. 1 is a block diagram depicting an exemplary embodiment of an FPGA 102 coupled to a program memory 120. The FPGA 102 illustratively comprises programmable logic circuits or "blocks", illustratively shown as CLBs 104, IOBs 106, and programmable interconnect 108 (also referred to as "programmable logic"), as well as configuration memory 116 for determining the functionality of the FPGA 102. The FPGA 102 may also include an embedded processor block 114, as well as various dedicated internal logic circuits, illustratively shown as blocks of random access memory ("BRAM 110"), configuration logic 118, digital clock management (DCM) blocks 112, and input/output (I/O) transceiver circuitry 122. Those skilled in the art will appreciate that the FPGA 102 may include other types of logic blocks and circuits in addition to those described herein.

As is well known in the art, the IOBs 106, the CLBs 104, and the programmable interconnect 108 may be configured to perform a variety of functions. Notably, the CLBs 104 are programmably connectable to each other, and to the IOBs 106, via the programmable interconnect 108. Each of the CLBs 104 may include one or more "slices" and programmable interconnect circuitry (not shown). Each CLB slice in turn includes various circuits, such as flip-flops, function generators (e.g., a look-up tables (LUTs)), logic gates, memory, and like type well-known circuits. The IOBs 106 are configured to provide input to, and receive output from, the CLBs 104.

Configuration information for the CLBs 104, the IOBs 106, and the programmable interconnect 108 is stored in the configuration memory 116. The configuration memory 116 may include static random access memory (SRAM) cells. The configuration logic 118 provides an interface to, and controls configuration of, the configuration memory 116. A configuration bitstream produced from the program memory 120 may be coupled to the configuration logic 118 through a configuration port 119. The configuration process of FPGA 102 is also well known in the art.

The I/O transceiver circuitry 122 may be configured for communication over any of a variety of media, such as wired, wireless, and photonic, whether analog or digital. The I/O transceiver circuitry 122 may comprise gigabit or multi-gigabit transceivers (MGTs). The DCM blocks 112 provide well-known clock management circuits for managing clock signals within the FPGA 102, such as delay lock loop (DLL) circuits and multiply/divide/de-skew clock circuits.

The processor block 114 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic of the FPGA 102 (e.g., CLBs 104, IOBs 106). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art.

The processor block 114 is coupled to the programmable logic of the FPGA 102 in a well known manner. For purposes of clarity by example, the FPGA 102 is illustrated with 12 CLBs, 16 IOBs, 4 BRAMs, 4 DCMs, and one processor block. Those skilled in the art will appreciate that actual FPGAs may include one or more of such components in any number of different ratios. For example, the FPGA 102 may be selected from the VIRTEX-II PRO family of products, commercially available from Xilinx, Inc. of San Jose, Calif.

Figure 2:
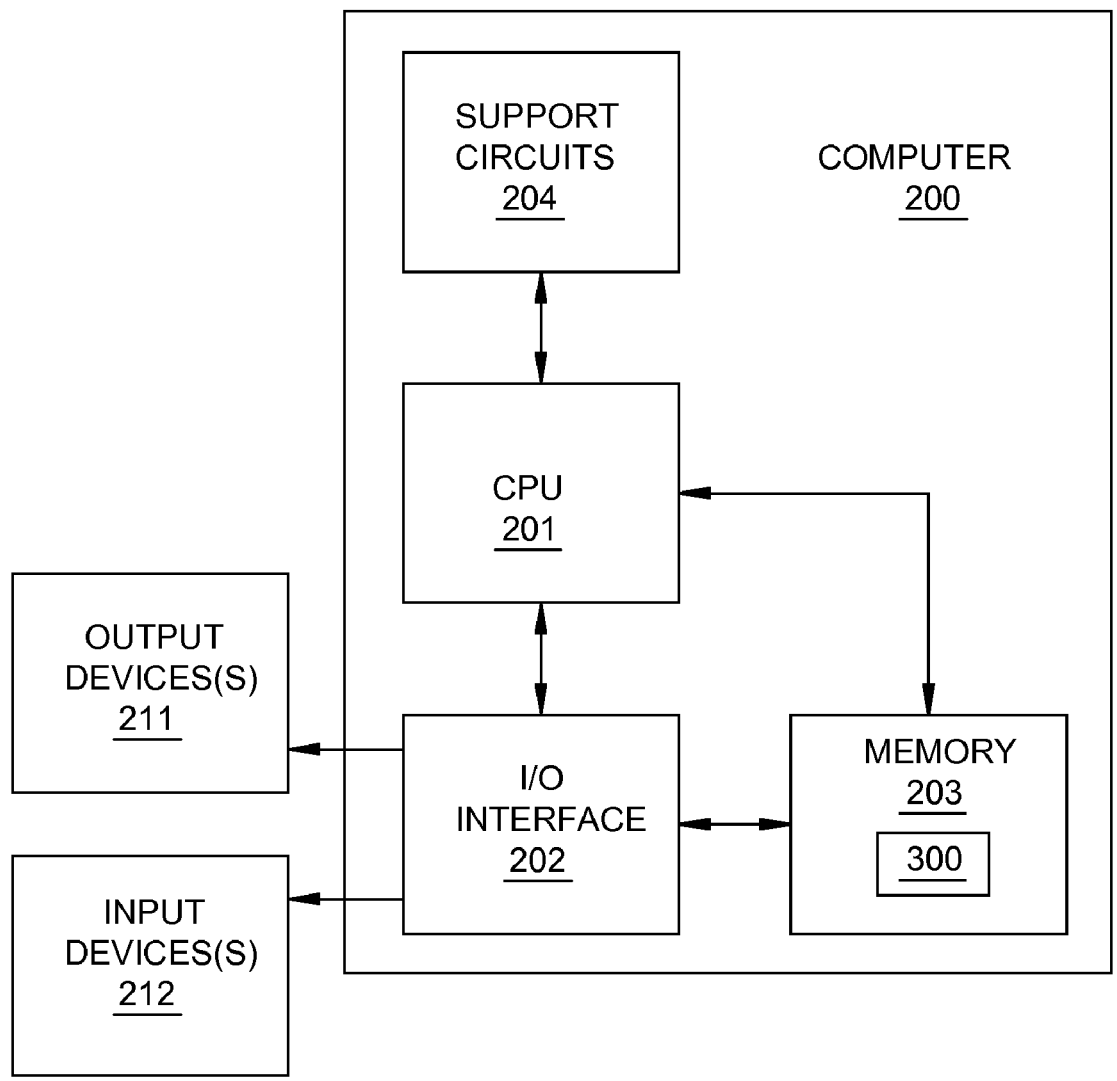
FIG. 2 is a block diagram depicting an exemplary embodiment of a computer suitable for implementing the processes and methods described herein.

FIG. 2 is a block diagram depicting an exemplary embodiment of a computer 200 suitable for implementing the processes and methods described herein. The computer 200 includes a central processing unit (CPU) 201, a memory 203, various support circuits 204, and an I/O interface 202. The CPU 201 may be any type of microprocessor known in the art. The support circuits 204 for the CPU 201 include conventional cache, power supplies, clock circuits, data registers, I/O interfaces, and the like. The I/O interface 202 may be directly coupled to the memory 203 or coupled through the CPU 201. The I/O interface 202 may be coupled to various input devices 212 and output devices 211, such as a conventional keyboard, mouse, printer, display, and the like.

The memory 203 may store all or portions of one or more programs and/or data to implement the processes, methods, and design tools described herein. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 200 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 203. The memory 203 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Figure 3:
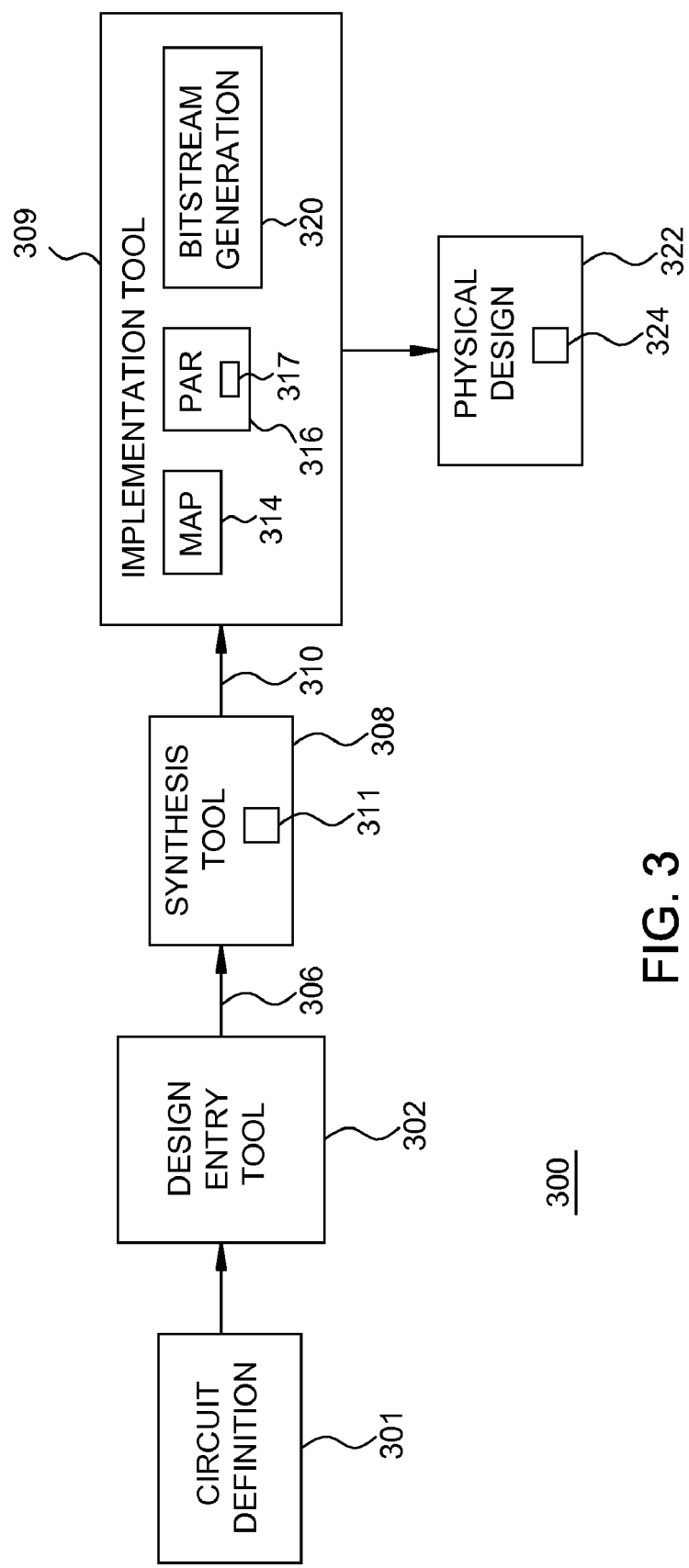
FIG. 3 is a block diagram depicting an exemplary embodiment of an integrated circuit design system in accordance with the invention.

FIG. 3 is a block diagram depicting an exemplary embodiment of an integrated circuit design system 300 in accordance with the invention. The design system 300 includes a design entry tool 302, a synthesis tool 308, and an implementation tool 309. In the present embodiment, the implementation tool 309 is configured to implement a design for a programmable logic device, such as an FPGA. The implementation tool 309 comprises a map tool 314, a place-and-route (PAR) tool 316, and a bitstream generation tool 320. The design system 300 may be implemented using the computer 200 shown in FIG. 2. Notably, the tools may be part of one or more software programs stored in the memory 203 and configured for execution by the CPU 201.

The design system 300 is configured to implement a circuit design specified by a user for a target integrated circuit device. In particular, the design entry tool 302 is configured to receive a design definition 301 and generate a functional description 306 of the circuit design. The design definition 301 includes a plurality of circuit elements, such as flip-flops, memories, LUTs, and the like, connected together via signal conductors ("nets" or "signals"). The term "elements" as used herein is meant to encompass both circuit elements and nets/signals.

The design entry tool 302 may include a graphic interface through which a designer connects symbols and blocks representing various components to produce a schematic description of the circuit design. The design entry tool 302 may also include a text interface through which a designer writes hardware description language (HDL) code to produce a structural and/or behavioral description of the circuit design in terms of HDL constructs. Examples of HDLs include the Very high-speed integrated circuit Hardware Description Language (VHDL) and VERILOG.

In one embodiment, the synthesis tool 308 is configured to receive the functional design data 306. The synthesis tool 308 processes the functional design data 306 to produce logical design data 310 (i.e., a logical representation of the circuit design). The logical design data 310 may include a logical network list ("netlist") supported by the target FPGA. For example, the synthesis tool 308 may process HDL code of the functional design data 306 to produce a netlist. The HDL synthesis process is well known in the art.

The synthesis tool 308 includes a protection circuit module 311 for generating an intellectual property (IP) protection circuit ("protection circuit") for the circuit definition 301. The generated protection circuit is configured to cause a configured version of the circuit definition 301 in an FPGA to become unstable in an unpredictable fashion after a defined evaluation time period. For example, the circuit definition 301 may define an IP core that may be provided to users for a fee to use in their circuit designs. The protection circuit allows such users to evaluate the IP core for a particular time period, after which the IP core will cease to function in its intended manner.

The map tool 314 is configured to receive the logical design data 310 (e.g., netlist). The map tool 314 maps the logical design data 310 onto primitive components within the target FPGA (i.e., the blocks and signals of the design definition 301 are mapped onto CLBs, IOBs, etc. of the target FPGA). The map tool 314 produces mapped design data 312.

The PAR tool 316 is configured to receive the mapped design data 312. The PAR tool 316 places the primitive components within the target FPGA and routes interconnects (e.g., signal conductors of the programmable interconnect) for the placed components. Notably, the PAR tool 316 includes a protection circuit insertion module 317 for inserting the protection circuit generated by the synthesis tool 308 into the circuit definition 301. Exemplary embodiments of a process for inserting a protection circuit are discussed below. The PAR tool 316 produces physical design data 322 for the target FPGA (i.e., a physical representation of the circuit design for the target FPGA). The physical design data 322 includes a mapped, placed, and routed version of the circuit definition 301, which includes a protection circuit 324 embedded therein. The physical design data 322 may also include bitstream data for the target FPGA produced by the bitstream generation tool 320. The bitstream data may used to configure the FPGA with the design definition 301 along with the protection circuit.

For purposes of clarity by example, the design system 300 is configured to implement a circuit for an FPGA. Those skilled in the art will appreciate that the invention may be used with other types of design systems that comprise a chain of tools for implementing a circuit (e.g., tool chains for ASICs or CPLDs).

Figure 4:
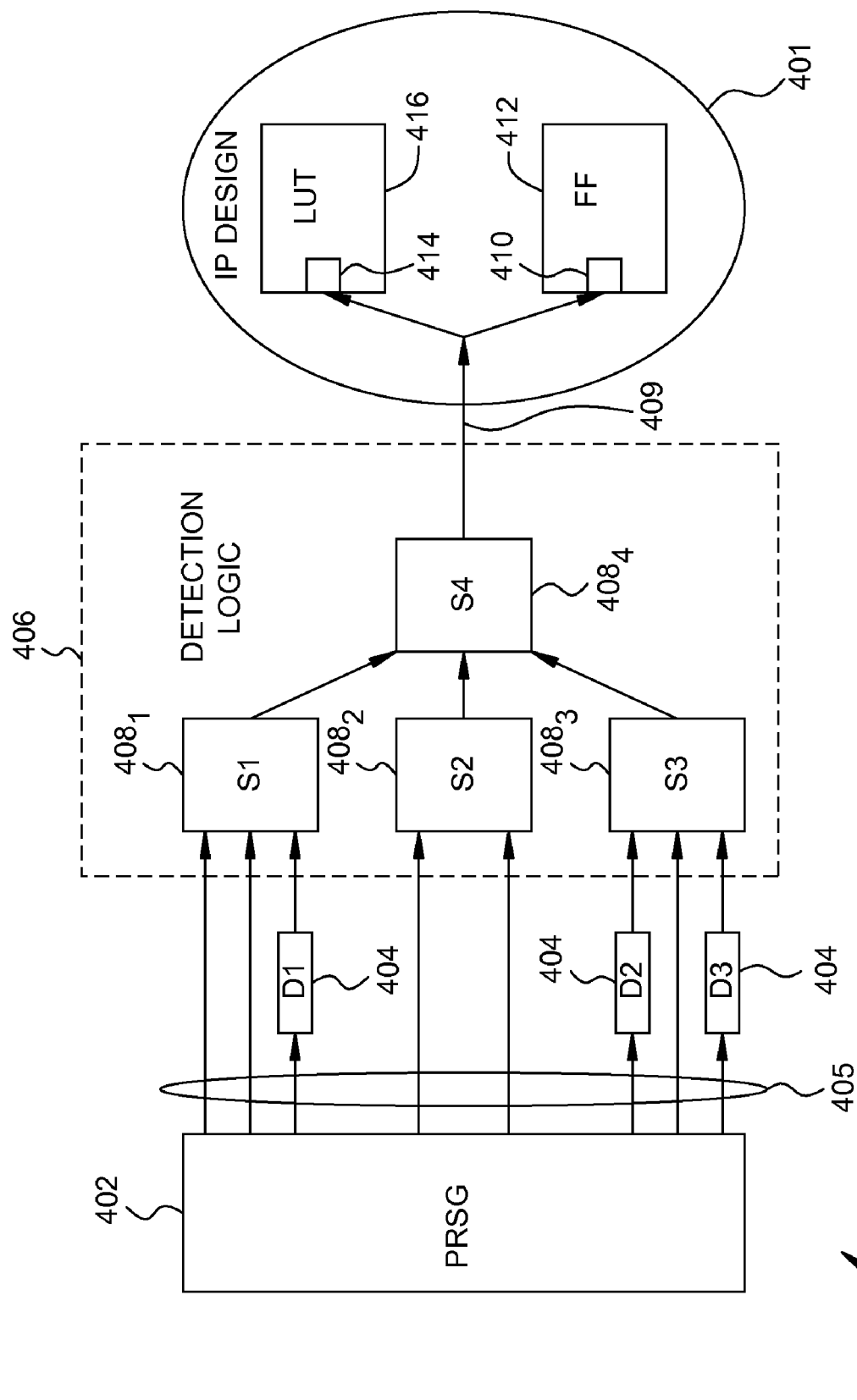
FIG. 4 is a block diagram depicting an exemplary embodiment of a protection circuit coupled to an IP design in accordance with the invention.

FIG. 4 is a block diagram depicting an exemplary embodiment of a protection circuit 400 coupled to an IP design 401 in accordance with the invention. The protection circuit 400 comprises a pseudorandom sequence generator (PRSG) 402, delay elements $404_1$ through $404_3$, and detection logic 406. The detection logic 406 comprises stages $408_1$ through $408_4$. An output terminal 409 of the detection logic 406 is coupled to the IP design 401.

The PRSG 402 includes eight output terminals 405. Two of the output terminals 405 are directly coupled to the stage $408_1$. One of the output terminals 405 is coupled to the stage $408_1$ through the delay element $404_1$. Another two of the output terminals 405 are directly coupled to the stage $408_2$. Two of the output terminals 405 are coupled to the stage $408_3$ through the delay element $404_2$ and the delay element $404_3$, respectively. Another one of the output terminals 405 is coupled directly to the stage $408_3$. For purposes of clarity by example, the PRSG 402 is shown as having eight output terminals. It is to be understood, however, that the PRSG 402 may include any number of output terminals (e.g., 30-40 output terminals). An output terminal of each of the stages $408_1$ through $408_3$ is coupled to the stage $408_4$. An output terminal of the stage $408_4$ is coupled to the IP design 401.

In operation, the PRSG 402 generates an 8-bit vector for each clock cycle (clock tick). For a given initial state, the output vector of the PRSG 402 may be computed for the nth clock cycle. For example, in one embodiment, the PRSG 402 comprises a linear feedback shift register (LFSR) based on a particular polynomial and having a particular width (a width of eight in the present embodiment). Given an initial state, the output vector of an LFSR may be computed for an arbitrary clock cycle using the associated polynomial in a well known manner.

The detection logic 406 is configured to detect particular bits of three output vectors of the PRSG 402. Each of the stages $408_1$ through $408_3$ is configured to detect a predefined word comprising bits of one or more output vectors produced by the PRSG 402. Each of the stages $408_1$ through $408_3$ asserts its output upon detection of its respective word. The sequence of words detected by the stages $408_1$ through $408_3$ is referred to as the "terminal vector." The stage $408_4$ is configured to detect the asserted outputs of each of the stages $408_1$ through $408_3$. When each of the stages $408_1$ through $408_3$ asserts its output, the stage $408_4$ asserts its output via the terminal 409. The stages $408_1$ through $408_4$ may comprise digital logic for implementing logical equations and may include various logic gates, such as AND gates, OR gates, XOR gates, inverters, and the like. The stages $408_1$ through $408_4$ may also include other stages (i.e., a given stage may itself be defined by stages).

For example, assume that the delay element $404_1$ provides a two clock cycle delay, the delay element $404_2$ provides a one clock cycle delay, and the delay element $404_3$ provides a three clock cycle delay. The stage $408_1$ is configured to detect a word comprising the first and second bits of the output vector produced at the nth clock cycle, and the third bit of the output vector produced at the $n-2^{nd}$ clock cycle. The stage $408_2$ is configured to detect a word comprising the fourth and fifth bits of the output vector produced at the nth clock cycle. The stage $408_3$ is configured to detect a word comprising the sixth bit of the output vector produced at the $n-1^{St}$ clock cycle, the seventh bit of the output vector produced at the nth clock cycle, and the eighth bit of the output vector produced at the $n-3^{rd}$ clock cycle. The stage $408_4$ asserts its output when each of the stages $408_1$ through $408_3$ detects its respective word (i.e., when the terminal vector is detected). From the above, it is readily apparent that the terminal vector is detected upon the occurrence of the nth clock cycle.

In this manner, the protection circuit 400 will drive the output terminal 409 with an asserted output after the nth clock cycle (i.e., the protection circuit 400 will generate a "cripple signal" after the nth clock cycle). The clock cycle that gives rise to the complete terminal vector may be chosen to provide a particular evaluation period for the IP design 401. After the selected evaluation duration (i.e., the nth clock cycle), the protection circuit 400 will assert the cripple signal via the output terminal 409.

In one embodiment, the output terminal 409 is coupled to a reset port of each of one or more flip-flops in the IP design 401 (e.g., a reset port 410 of a flip-flop 412). In another embodiment, the output terminal 409 is coupled unused input port(s) of one or more LUTs in the IP design 401 (e.g., unused input ports 414 of a LUT 416). In this manner, the IP design 401 will become unstable and will operate in an unpredictable fashion (i.e., the IP design 401 will cease to function in its intended manner, rendering the IP design 401 ineffective).

The protection circuit 400 may be automatically generated during synthesis of a particular IP design. Various characteristics of the protection circuit 400 may vary from one instance to another, such as the number of delay elements, the length delay provided by each delay element, the number of bits output by the PRSG, and the number and configuration of stages in the detection logic, and the number of inputs to each stage in the detection logic. The characteristics of the protection circuit 400 may be randomly selected for each IP design, although identification of critical sections of the IP design may restrict this selection. Since the protection circuit changes from one instance to the next, the protection circuit 400 is more difficult to detect by "hackers" and those looking to defeat the protection circuit. An exemplary process for generating the protection circuit 400 is described below with respect to FIG. 5.

In addition, the interface of the protection circuit to the IP design may be automatically generated during implementation of a particular IP design. As described above, in one embodiment, the cripple signal is coupled to the reset port of one or more flip-flops in the IP design. Such flip-flops may be randomly selected each time an instance of the protection circuit 400 is coupled to an IP design. In another embodiment, the cripple signal is coupled to unused input ports of various LUTs in the IP design. Such LUTs may be randomly selected each time an instance of the protection circuit 400 is coupled to an IP design. Since the interface between the protection circuit 400 and the IP design changes form one instance to the next, the protection circuit 400 is more difficult to detect by hackers and those looking to defeat the protection circuit. Exemplary processes for generating an interface between the protection circuit 400 and an IP design are described below with respect to FIGS. 6 and 7.

Figure 5:
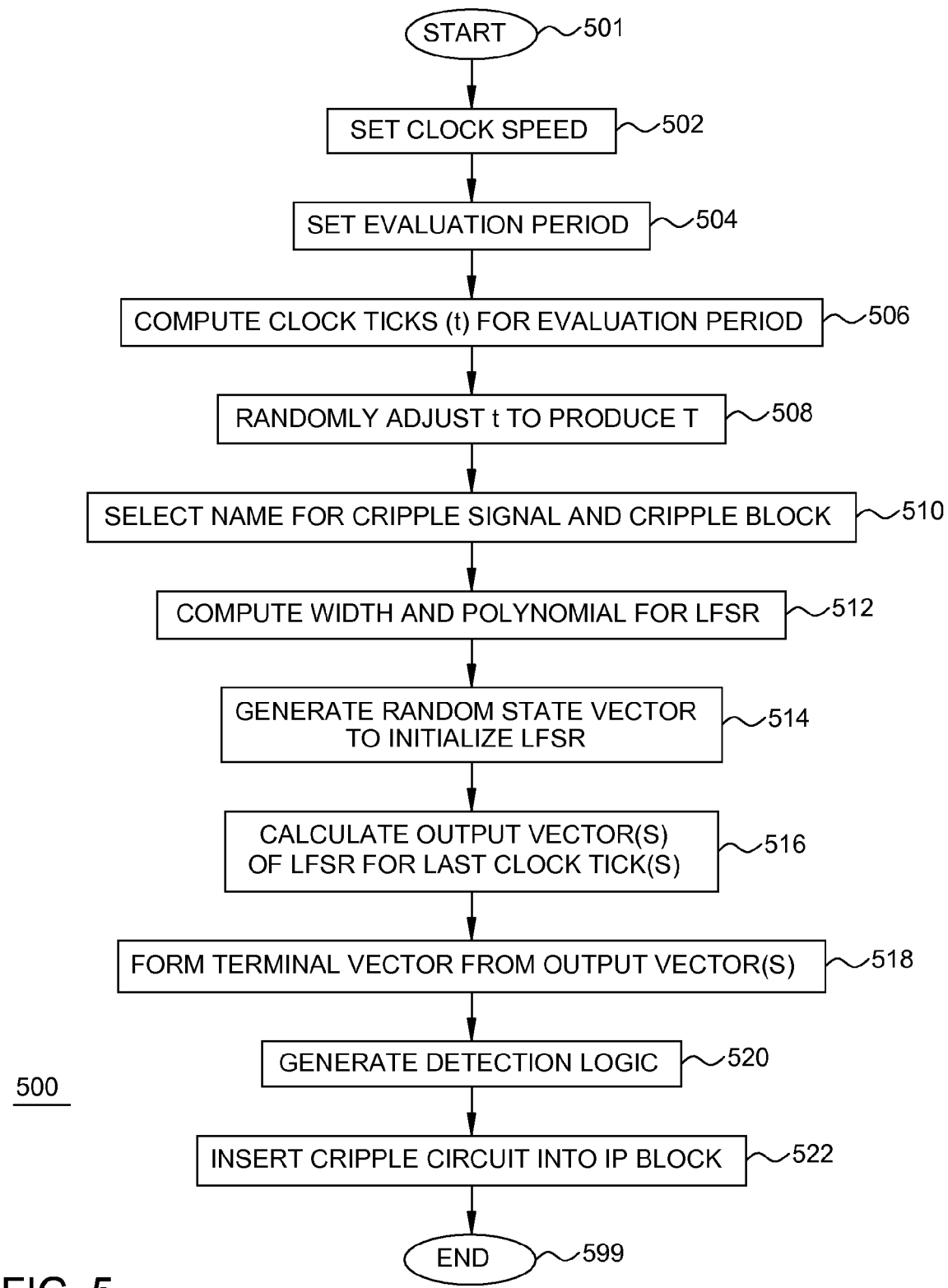
FIG. 5 is a flow diagram depicting an exemplary embodiment of a method for generating a protection circuit in accordance with the invention.

FIG. 5 is a flow diagram depicting an exemplary embodiment of a method 500 for generating a protection circuit in accordance with the invention. The method 500 begins at step 501. At step 502, a clock speed is selected. At step 504, an evaluation period is selected. At step 506, the number of clock ticks comprising the evaluation period is computed. Notably, the number of clock ticks may be computed by the following:

$$t = s \times d,$$

where t is the number of clock ticks, s is the selected clock speed in hertz, and d is the evaluation duration in seconds. At step 508, the number of computed clock ticks for the evaluation period is randomly adjusted. In one embodiment, a number of clock ticks, T, is computed by multiplying the number of clock ticks, t, by a random number r between 1.00 and 1.01.

At step 510, a name is selected for the cripple signal and the protection circuit ("cripple block"). The developer of the IP design may select names for the cripple signal and the cripple block so as to disguise the use of the block and the signal within the IP design. At step 512, a width and polynomial is selected for an LFSR that runs for at least T clock ticks (computed at step 508) without repeating. At step 514, a random reset state vector is selected to initialize the LFSR configured at step 512.

At step 516, one or more output vectors of the LFSR are calculated for a respective one or more last clock ticks. For example, three output vectors, ov1, ov2, and ov3 may be calculated for clock ticks T−2, T−1, and T, respectively (i.e., the last three clock ticks). The output vectors may be calculated using the selected width and polynomial of the LFSR in a well known manner. At step 518, a terminal vector, tv, is formed using the output vector(s) calculated at step 516. In one embodiment, the terminal vector is formed by randomly selecting one or more bits from each of the calculated output vector(s). For example, if three output vectors are calculated at step 516 (ov1, ov2, and ov3), and w is the width of the LFSR, then an exemplary terminal vector, tv, may be in the form {ov1[w−1], ov3[w−2], ov1 [w−3], . . . , ov2[0]}.

At step 520, detection logic is generated to detect the terminal vector formed at step 518. The detection logic is randomly generated to include one or more stages, where each stage is configured to detect one or more bits of the terminal vector, tv. The stages of the detection logic are configured to detect all of the bits in the terminal vector. For example, the detection logic 406 of FIG. 4 is configured to detect all eight bits of the terminal vector, where the stage $408_1$ detects the first three bits, the stage $408_2$ detects the next two bits, and the stage $408_3$ detects the next three bits. The detection logic is configured to assert the cripple signal upon detection of the terminal vector. At step 522, the protection circuit is inserted into the IP block. Exemplary processes for inserting a protection circuit into an IP design are described below. The method 500 ends at step 599.

Figure 6:
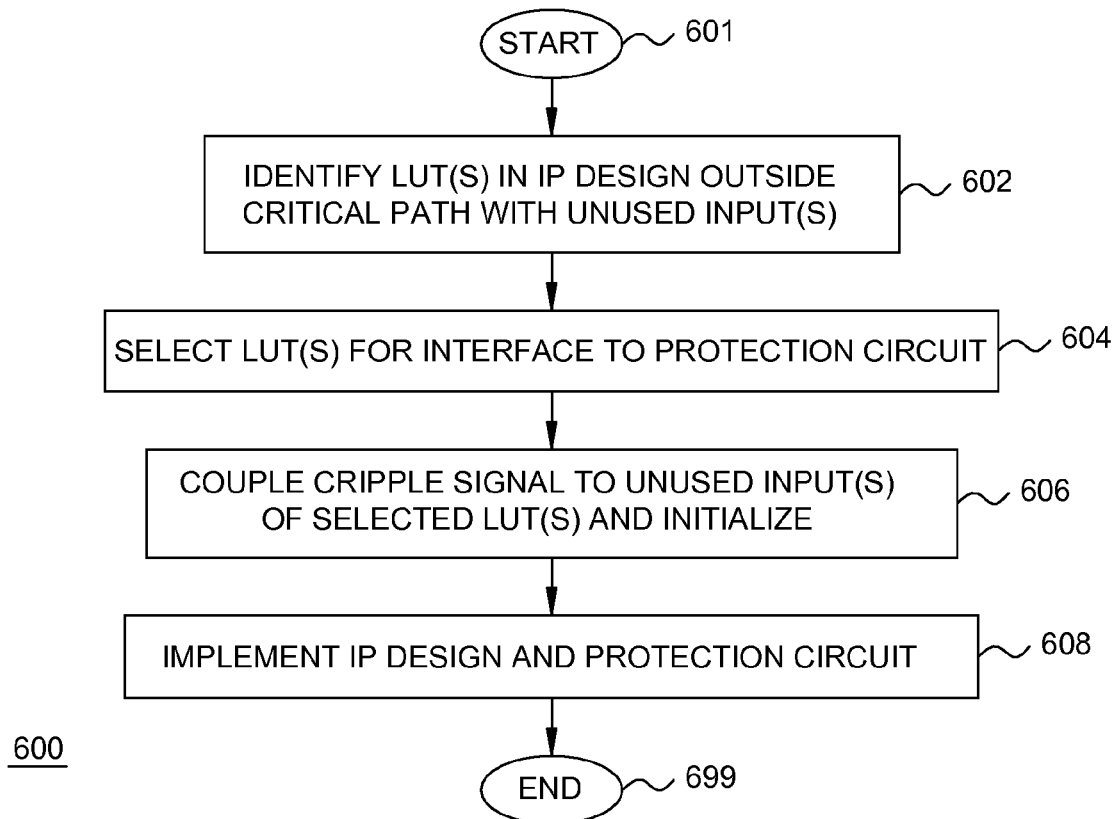
FIG. 6 is a flow diagram depicting an exemplary embodiment of a method for inserting a protection circuit into an IP design in accordance with the invention.

FIG. 6 is a flow diagram depicting an exemplary embodiment of a method 600 for inserting a protection circuit into an IP design in accordance with the invention. The method 600 begins at step 601. At step 602, LUTs are identified in the IP design that are not on the critical path and that include unused inputs. At step 604, one or more of the LUTs identified at step 602 are selected to provide an interface to the protection circuit. Only the LUTs that are not on the critical path are identified at step 602 so that the interface of the protection circuit will not adversely affect the intended function of the IP design during the evaluation period.

At step 606, the cripple signal of the protection circuit is coupled to the unused inputs of the LUT(s) selected at step 604 and the selected LUTs are initialized. For example, the selected LUTs may be configured to use the cripple signal in an OR, AND, NOR, or NAND fashion. At step 608, the IP design is implemented with the protection circuit. For example, the IP design and the embedded protection circuit may be mapped, placed, and routed. The method 600 ends at step 699.

Figure 7:
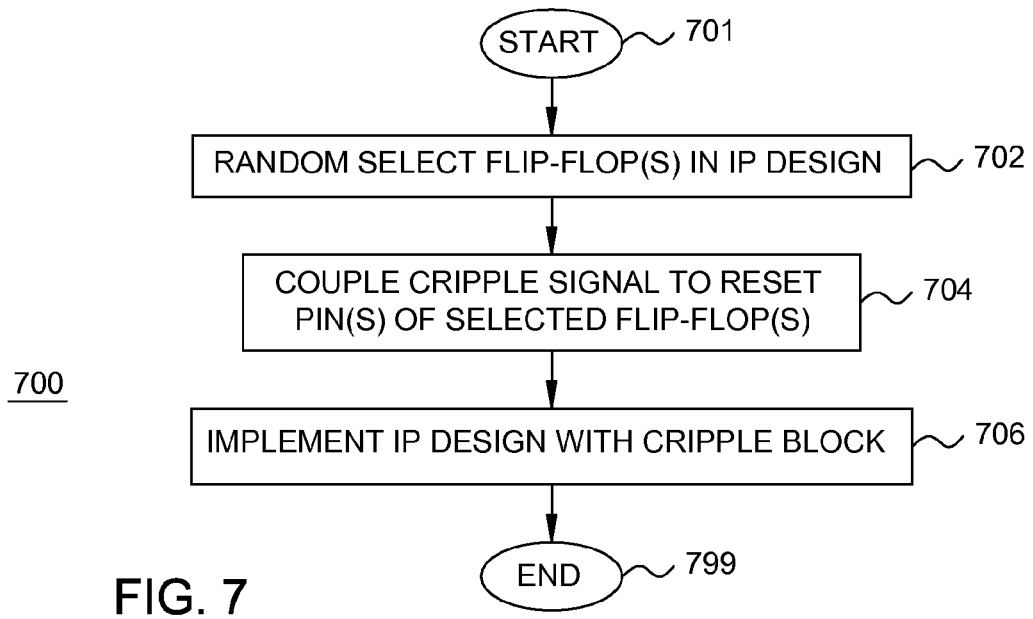
FIG. 7 is a flow diagram depicting another exemplary embodiment of a method for inserting a protection circuit into an IP design in accordance with the invention.

FIG. 7 is a flow diagram depicting another exemplary embodiment of a method 700 for inserting a protection circuit into an IP design in accordance with the invention. The method 700 begins at step 701. At step 702, flip-flops in the IP design are randomly selected. At step 704, the cripple signal of the protection circuit is coupled to the reset pin(s) of the selected flip-flops. At step 706, the IP design is implemented with the protection circuit. For example, the IP design and the embedded protection circuit may be mapped, placed, and routed. The method 700 ends at step 799.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A circuit design system, comprising:
   a design entry tool for specifying a circuit design;
   a synthesis tool for synthesizing said circuit design, said synthesis tool including a protection circuit module configured to define a protection circuit for the circuit design, the protection circuit module configured to: define a sequence generator to produce a pseudorandom sequence of output vectors, select a plurality of output vectors from said sequence of output vectors, randomly select bits from said plurality of output vectors to define a terminal vector, and generate detection logic for detecting said terminal vector; and an implementation tool for implementing said circuit design and said protection circuit in said circuit design.

2. The system of claim 1, wherein said implementation tool is configured to provide an interface between said protection circuit and said circuit design.

3. The system of claim 2, wherein said detection logic is configured to assert a signal in response to detection of said terminal vector, and wherein said implementation tool is configured to:

identify at least one lookup table (LUT) in said circuit design having at least one unused input terminal;

couple said signal to said at least one unused input terminal of said at least one LUT; and place and route said circuit design and said protection circuit.

4. The system of claim 2, wherein said detection logic is configured to assert a signal in response to detection of said terminal vector, and wherein said implementation tool is configured to:

randomly select at least one flip-flop in said integrated circuit design;

couple said signal to at least one reset port of said at least one flip-flop; and place and route said circuit design and said protection circuit.

* * * * *